United States Patent
Wen (10) Patent No.: US 8,237,497 B2
(45) Date of Patent: Aug. 7, 2012

(54) AMPLIFIER FOR PROCESSING DIFFERENTIAL INPUT USING AMPLIFIER CIRCUITS WITH DIFFERENT DRIVING CAPABILITIES AND/OR DIFFERENT FREQUENCY COMPENSATION CHARACTERISTICS

(75) Inventor: Sung-Han Wen, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/882,208

(22) Filed: Sep. 15, 2010

(65) Prior Publication Data

US 2011/0241770 A1 Oct. 6, 2011

Related U.S. Application Data

(60) Provisional application No. 61/321,144, filed on Apr. 6, 2010.

(51) Int. Cl.
*H03F 3/45* (2006.01)
(52) U.S. Cl. .......................................... 330/69; 330/254
(58) Field of Classification Search .......... 330/252–261, 330/69
See application file for complete search history.

(56) References Cited

U.S. PATENT DOCUMENTS

| 6,208,206 B1 | 3/2001 | Leung |
| 7,843,264 B2 * | 11/2010 | Davierwalla et al. ......... 330/253 |
| 7,889,005 B2 * | 2/2011 | Simon ........................... 330/254 |

OTHER PUBLICATIONS

Dhanasekaran, Design of Three-Stage Class-AB 16 Ohm Headphone Driver Capable of Handling Wide Range of Load Capacitance, IEEE Journal of Solid-State Circuits, vol. 44, No. 6, pp. 1734-1744, Jun. 2009.

* cited by examiner

Primary Examiner — Hieu Nguyen
(74) Attorney, Agent, or Firm — Winston Hsu; Scott Margo (57) ABSTRACT

An amplifier processes a differential input received at a differential input port. The amplifier includes a first amplifier circuit and a second amplifier circuit. The first amplifier circuit is disposed in a first signal path between a first input node and a first output node of the amplifier, and arranged to amplify a first input signal received at the first input node and accordingly generate a first amplified signal to the first output node. The second amplifier circuit is disposed in a second signal path between a second input node and a second output node of the amplifier, and arranged to amplify a second input signal received at the second input node and accordingly generate a second amplified signal to the second output node. A driving capability of the first amplifier circuit is different from a driving capability of the second amplifier circuit.

26 Claims, 6 Drawing Sheets

AMPLIFIER FOR PROCESSING DIFFERENTIAL INPUT USING AMPLIFIER CIRCUITS WITH DIFFERENT DRIVING CAPABILITIES AND/OR DIFFERENT FREQUENCY COMPENSATION CHARACTERISTICS

CROSS REFERENCE TO RELATED APPLICATIONS

This application claims the benefit of U.S. Provisional Application No. 61/321,144, filed on Apr. 6, 2010 and incorporated herein by reference.

BACKGROUND

The disclosed embodiments of the present invention relate to processing a differential input, and more particularly, to an amplifier for processing a differential input using amplifier circuits with different driving capabilities and/or different frequency compensation characteristics.

Generally speaking, a differential amplifier is devised to process a differential input. Taking an audio playback application for example, a current steering digital-to-analog converter (DAC) may be employed due to its low power consumption, and an output of the current steering DAC may be fed into a transimpedance amplifier implemented using a fully-differential amplifier due to the fact that the use of the fully-differential amplifier can effectively reduce the output impedance requirement of the current steering DAC. However, it is possible that the audio playback application is required to drive a single-ended load such as a headphone speaker. If one output node of the differential output port of the fully-differential amplifier is simply coupled to the single-ended load for driving the single-ended load, the mismatched loop gain responses for the positive input signal and the negative input signal of the differential input may cause significant output distortion, leading to degradation of the audio playback quality.

SUMMARY

In accordance with exemplary embodiments of the present invention, an amplifier for processing a differential input using amplifier circuits with different driving capabilities and/or different frequency compensation characteristics is proposed to improve the output distortion and/or the amplifier stability.

According to one aspect of the present invention, an exemplary amplifier for processing a differential input received at a differential input port is disclosed. The differential input includes a first input signal and a second input signal. The exemplary amplifier includes a first amplifier circuit and a second amplifier circuit. The first amplifier circuit is disposed in a first signal path between a first input node of the differential input port and a first output node of the amplifier, and arranged to amplify the first input signal received at the first input node and accordingly generate a first amplified signal to the first output node. The second amplifier circuit is disposed in a second signal path between a second input node of the differential input port and a second output node of the amplifier, and arranged to amplify the second input signal received at the second input node and accordingly generate a second amplified signal to the second output node. A driving capability of the first amplifier circuit is different from a driving capability of the second amplifier circuit.

According to another aspect of the present invention, an exemplary amplifier for processing a differential input received at a differential input port is disclosed. The differential input includes a first input signal and a second input signal. The exemplary amplifier includes a first amplifier circuit, a second amplifier circuit, and a control circuit. The first amplifier circuit is disposed in a first signal path between a first input node of the differential input port and a first output node of the amplifier, and arranged to amplify the first input signal received at the first input node and accordingly generate a first amplified signal to the first output node for driving a first load. The second amplifier circuit is disposed in a second signal path between a second input node of the differential input port and a second output node of the amplifier, and arranged to amplify the second input signal received at the second input node and accordingly generate a second amplified signal to the second output node. The control circuit is coupled between the first amplifier circuit and the first load. The control circuit is arranged to detect a characteristic value of the first load to generate a detection result and adjust the first amplifier circuit according to the detection result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The conception of the present invention is to provide an amplifier with internal amplifier circuits having different driving capabilities, thereby improving the output distortion. Moreover, the amplifier circuits with different driving capabilities may further have different frequency compensation characteristics to thereby improve the amplifier stability. For example, to improve the amplifier stability, a frequency compensation network of one of the amplifier circuits may be adjusted in response to a detection result of a characteristic value of the connected single-ended load, such as a load detection result of the connected single-ended load. In addition, by employing such a pseudo-differential amplifier design, the overall power consumption of the amplifier can be reduced. The technical features of the present invention are detailed as follows.

Figure 1:
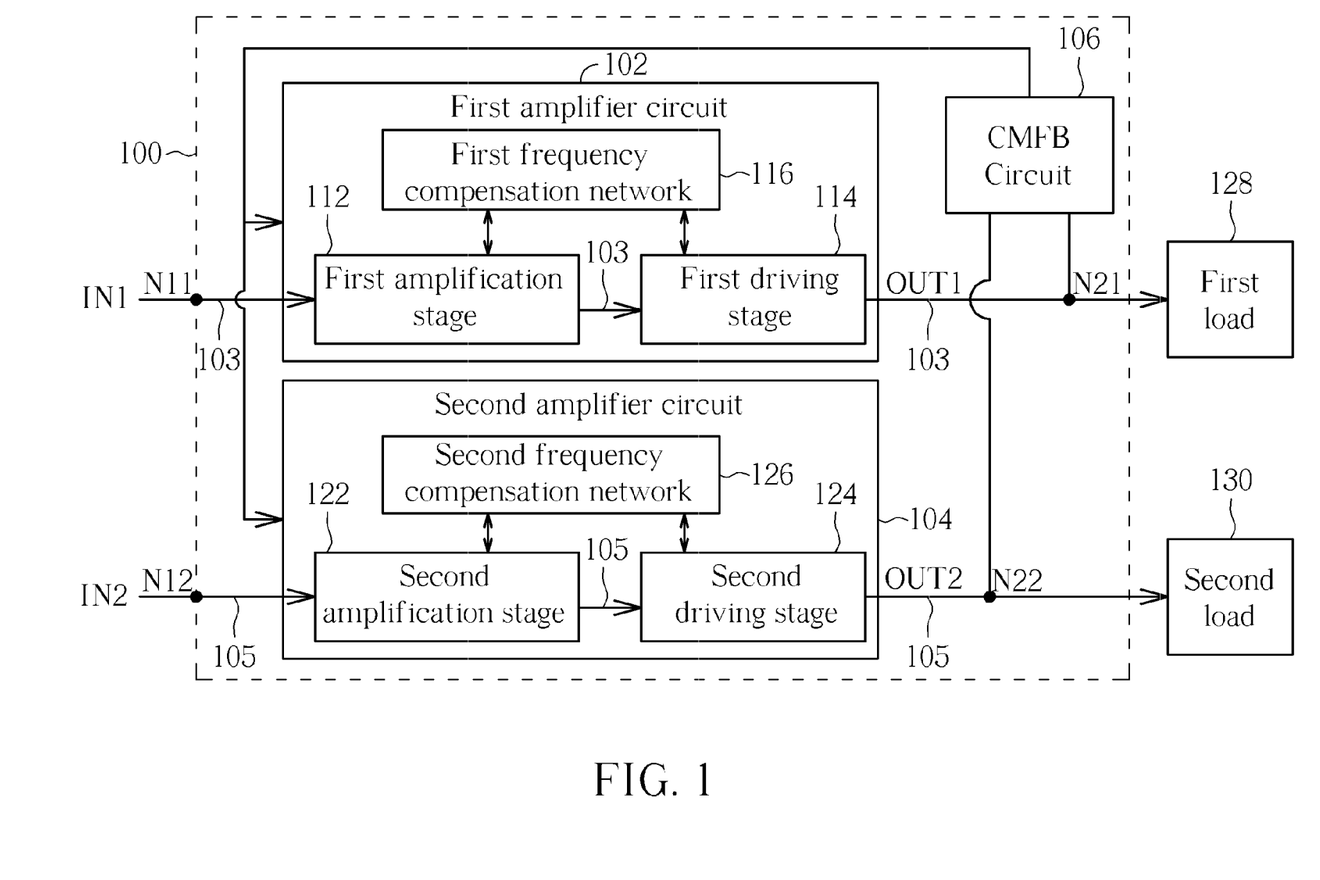
FIG. 1 is a block diagram illustrating an amplifier for processing a differential input according to a first exemplary embodiment of the present invention.

FIG. 1 is a block diagram illustrating an amplifier for processing a differential input according to a first exemplary embodiment of the present invention. The amplifier 100 processes a differential input received at a differential input port, wherein the differential input includes a first input signal IN1 and a second input signal IN2, and the differential input port includes a first input node N11 and a second input node N12. The amplifier 100 includes, but is not limited to, a first amplifier circuit 102, a second amplifier circuit 104, and a common-mode feedback (CMFB) circuit 106. Please note that only the functional blocks pertinent to the present inventions are shown in FIG. 1. The amplifier 100 may have additional functional blocks included therein, depending upon actual design consideration. The first amplifier circuit 102 is disposed in a first signal path 103 between the first input node N11 and a first output node N21 of the amplifier 100. The first amplifier circuit 102 is therefore arranged to amplify the first input signal IN1 received at the first input node N11 and accordingly generate a first amplified signal OUT1 to the first output node N21. Regarding the second amplifier circuit 104, it is disposed in a second signal path 105 between the second input node N12 and a second output node N22 of the amplifier 100. The second amplifier circuit 104 is arranged to amplify the second input signal IN2 received at the second input node N12 and accordingly generate a second amplified signal OUT2 to the second output node N22.

The first amplifier circuit 102 includes, but is not limited to, a first amplification stage 112, a first driving stage 114, and a first frequency compensation network 116. As can be seen from FIG. 1, the first amplification stage 112 is coupled between the first input node N11 and the first driving stage 114, and the first driving stage 114 is coupled between the first amplification stage 112 and the first output node N21. The second amplifier circuit 104 includes, but is not limited to, a second amplification stage 122, a second driving stage 124, and a second frequency compensation network 126. Similarly, as can be seen from FIG. 1, the second amplification stage 122 is coupled between the second input node N12 and the second driving stage 124, and the second driving stage 124 is coupled between the second amplification stage 122 and the second output node N22.

In this exemplary embodiment, though the differential input, including the first input signal IN1 and the second input signal IN2, is fed into the amplifier 100, a driving capability of the first amplifier circuit 102 is different from a driving capability of the second amplifier circuit 104. By way of example, but not limitation, a first load 128 driven by the first amplified signal OUT1 may have a load value different from a load value of a second load 130 driven by the second amplified signal OUT2. Since there is a mismatch between the driving capabilities of the first amplifier circuit 102 and the second amplifier circuit 104 under the condition where a mismatch exists between load values of the first load 128 and the second load 130, a loop gain response of the first amplifier circuit 102 may be substantially identical to a loop gain response of the second amplifier circuit 104. For example, the first load 128 may be a single-ended load (e.g., a headphone speaker or an external amplifier desired to be driven by the amplifier 100), and has a load value greater than the load value of the second load 130 which may be simply a resistor coupled between the second output node N22 and the ground. To put it another way, the amplifier 100 acts as a pseudo-differential amplifier having the first amplification stage 112 and the second amplification stage 122 arranged in a fully-differential configuration and the first driving stage 114 and the second driving stage 124 arranged to have different driving capabilities (e.g., the driving capability of the first driving stage 114 is particularly designed to be greater than the driving capability of the second driving stage 124). As the loop gain response of the first amplifier circuit 102 is substantially identical to the loop gain response of the second amplifier circuit 104, the single-ended output OUT1 generated to the first load 128 which is a single-ended load will have lower distortion. Therefore, the amplifier 100 has good linearity due to low total harmonic distortion (THD).

In addition, the CMFB circuit 106 may be employed to sense the output common-mode level and then generate a common-mode feedback signal to the first amplifier circuit 102 and the second amplifier circuit 104 for correcting the common-mode voltage of the first amplifier circuit 102 and the second amplifier circuit 104 arranged in a fully-differential configuration. For example, to make the first output signal OUT1 and the second output signal OUT2 fully differential, the CMFB circuit 106 may be realized by a high-speed CMFB circuit which can swiftly respond to the output common-mode level variation, thereby further lowering the distortion. When the amplifier 100 is operated to process a low-frequency differential input, the first amplifier circuit 102 and the second amplifier circuit 104 with different driving capabilities, such as the first driving stage 114 and the second driving stage 124 with different driving capabilities, may make the amplifier output have lower distortion. However, when the amplifier 100 is operated to process a high-frequency differential input, an amplifier stability problem may be arisen due to the high-speed CMFB circuit 106 and the mismatch of the driving capabilities of the first amplifier circuit and the second amplifier circuit 104. Specifically, in a case where the first driving stage 114 has a greater driving capability than the second driving stage 124, the parasitic capacitance of the first driving stage 114 would be greater than the parasitic capacitance of the second driving stage 124. Thus, regarding the high-frequency band, the frequency response of the first amplifier circuit 102 disposed in the first signal path 103 would be different from the frequency response of the second signal path 105 disposed in the second signal path 105 due to different pole positions affected by the mismatched parasitic capacitance. As mentioned above, when the amplifier 100 is operated to process a low-frequency differential input, the CMFB circuit 106 may be realized by a high-speed CMFB circuit to lower the distortion. However, when the amplifier 100 is operated to process a high-frequency differential input, the frequency response of the first amplifier circuit 102 used to generate the first output signal OUT1 to the first load 128 (e.g., a single-ended output signal to a single-ended load) may be affected by a different frequency response owned by the second amplifier circuit 104 due to the pole coupling effect induced by the high-speed CMFB circuit 106. As a result, the amplifier stability may be degraded.

To prevent the amplifier stability from being degraded due to the mismatch between the driving capabilities of the first amplifier circuit 102 and the second amplifier circuit 104, the first frequency compensation network 116 and the second frequency compensation network 126 should be designed, individually. For example, a frequency compensation characteristic of the first frequency compensation network 116 is different from a frequency compensation characteristic of the second frequency compensation network 126. In this way, the first frequency compensation network 116 and second frequency compensation network 126 with different frequency compensation characteristics can effectively reduce the difference between the frequency responses of the first amplifier circuit 102 and the second amplifier circuit 104 in the high-frequency band. For example, the properly designed first frequency compensation network 116 and second frequency compensation network 126 are capable of making the frequency response of the first amplifier circuit 102 similar to or substantially identical to the frequency response of the second amplifier circuit 104. To put it simply, by having the first frequency compensation network 116 and second frequency compensation network 126 with different frequency compensation characteristics implemented in the amplifier 100, the unwanted pole coupling effect resulted from the high-speed CMFB circuit 106 can be avoided, leading to improved amplifier stability.

It should be noted that any means capable of making the first frequency compensation network 116 and second frequency compensation network 126 have different frequency compensation characteristics can be employed. For example, the first frequency compensation network 116 and the second frequency compensation network 126 may have the same circuit structure; however, at least one circuit element of the same circuit structure has a first setting in the first frequency compensation network 116 and a second setting in the second frequency compensation network 126, where the first setting is different from the second setting. In an alternative design, the first frequency compensation network 116 and the second frequency compensation network 126 are implemented using different circuit structures, respectively.

In above implementation, the first amplifier circuit 102 and the second amplifier circuit 104 having different driving capabilities are realized by making the first driving stage 114 and the second driving stage 124 have different driving capabilities (e.g., different transconductance settings). However, this is for illustrative purposes only. In an alternative design, the first amplifier circuit 102 and the second amplifier circuit 104 having different driving capabilities may be realized by making other internal circuit elements respectively disposed in the first signal path 103 and the second signal path 105 have different driving capabilities. Moreover, in above implementation, the first amplifier circuit 102 and the second amplifier circuit 104 are properly designed to have different driving capabilities and different frequency compensation characteristics. However, any amplifier design with the amplifier circuits disposed in different signal paths and having different driving capabilities for processing a differential input obeys the spirit of the present invention and falls within the scope of the present invention.

Figure 2:
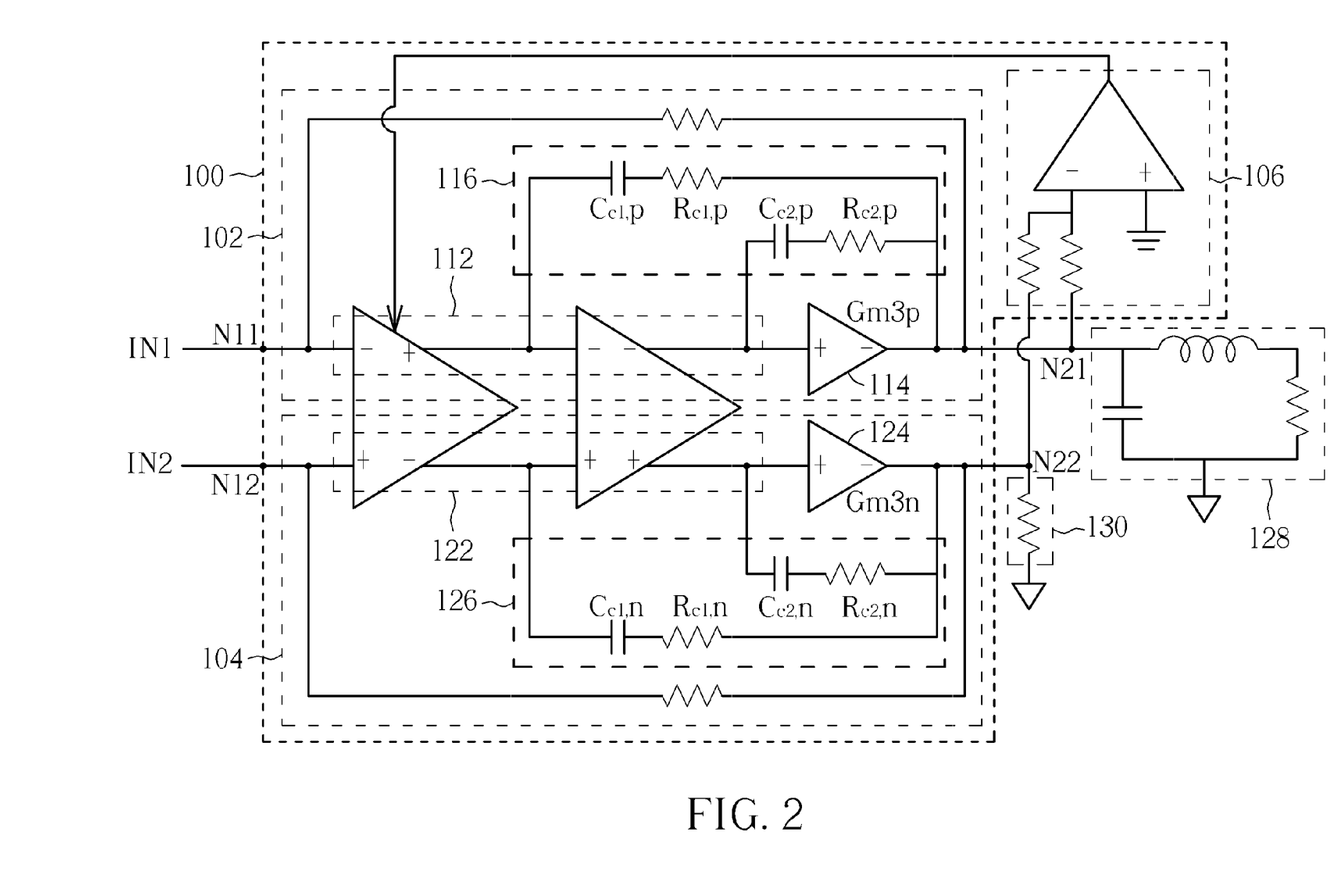
FIG. 2 is a circuit diagram illustrating a first exemplary implementation of the amplifier shown in FIG. 1.

For a better understanding of technical features of the present invention, several exemplary implementations of the amplifier 100 shown in FIG. 1 are given as follows. Please refer to FIG. 2, which is a circuit diagram illustrating a first exemplary implementation of the amplifier 100 shown in FIG. 1. As shown in FIG. 2, the amplifier 100 is a multi-stage pseudo-differential amplifier. Each of the first frequency compensation network 116 and the second frequency compensation network 126 employs a nested miller compensation with nulling resistor (NMCNR) structure. The first frequency compensation network 116 has capacitors $C_{c1,p}$, $C_{c2,p}$ and resistors $R_{c1,p}$, $R_{c2,p}$ included therein. Similarly, the second frequency compensation network 126 has capacitors $C_{c1,n}$, $C_{c2,n}$ and resistors $R_{c1,n}$, $R_{c2,n}$ included therein. It should be noted that the capacitors $C_{c1,p}$ and $C_{c1,n}$ may have different capacitance values, the capacitors $C_{c2,p}$ and $C_{c2,n}$ may have different capacitance values, the resistors $R_{c1,p}$, $R_{c1,n}$ may have different resistance values, and/or the resistors $R_{c2,p}$, $R_{c2,n}$ may have different resistance values to thereby make the first frequency compensation network 116 and the second frequency compensation network 126 have different frequency compensation characteristics. Moreover, the transconductance Gm3$p$ of the first driving stage 114 is greater than the transconductance Gm3$n$ of the second driving stage 124. Thus, the driving capability of the first amplifier circuit 102 is greater than that of the second amplifier circuit 104 though the first amplification stage 112 and the second amplification stage 122 are arranged in a fully-differential configuration. In addition, the first load 128 is a single-ended load such as a headphone speaker or an external amplifier required to be driven by the amplifier 100, whereas the second load 130 is a light load. For example, the second load 130 may be an input resistance (e.g., 10KΩ) of an input transistor coupled to the second output node N22 when the second output node N22 is used for testing/calibration/signal amplification with an external amplifier, or may be an output resistance of an output transistor of the second driving stage 124.

Figure 3:
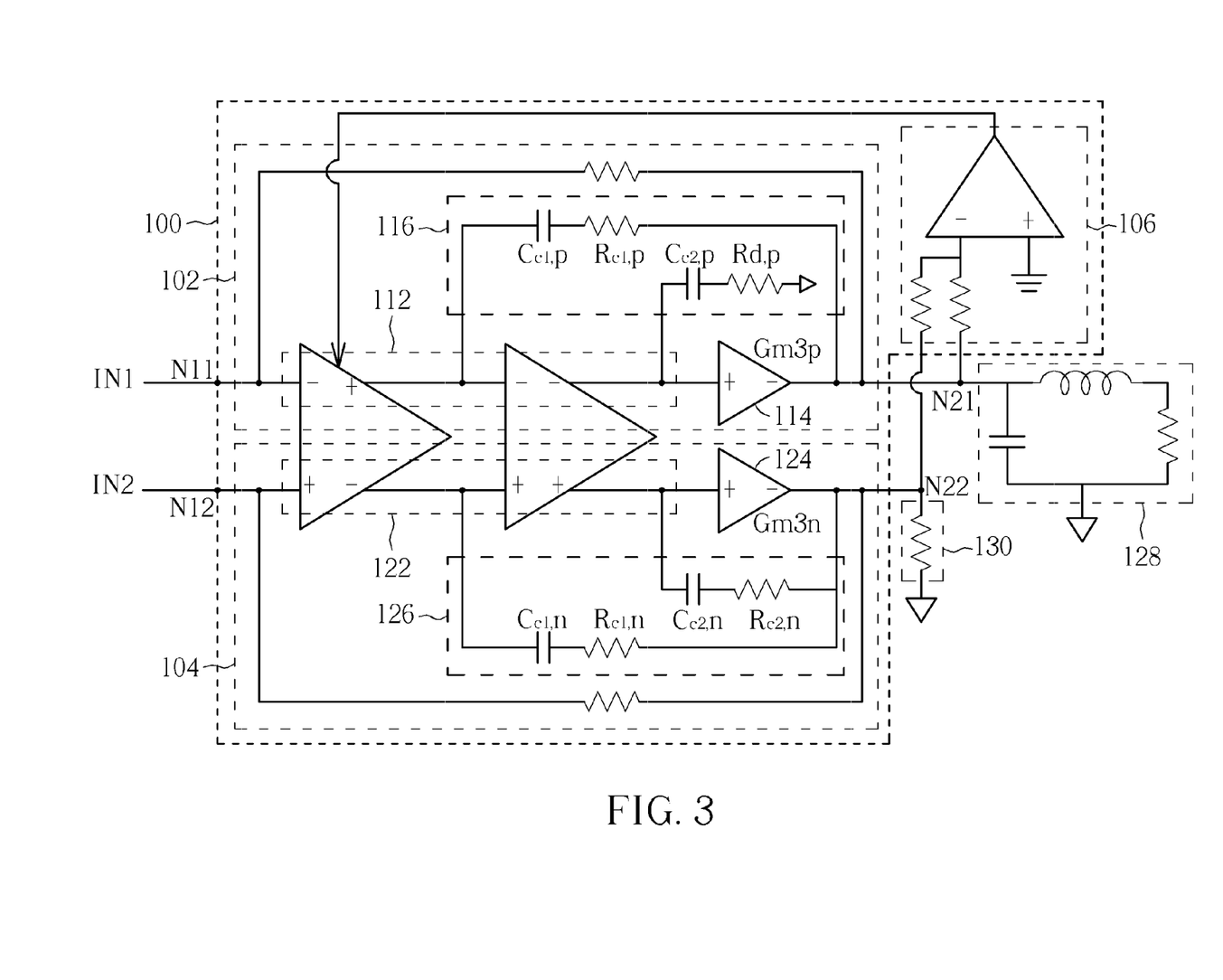
FIG. 3 is a circuit diagram illustrating a second exemplary implementation of the amplifier shown in FIG. 1.

Please refer to FIG. 3, which is a circuit diagram illustrating a second exemplary implementation of the amplifier 100 shown in FIG. 1. As shown in FIG. 3, the amplifier 100 is a multi-stage pseudo-differential amplifier. The second frequency compensation network 126 employs the NMCNR structure. However, to reduce the chip area and power consumption, the first frequency compensation network 116 employs a damping factor control frequency compensation (DFCFC) structure instead of the NMCNR structure. The first frequency compensation network 116 has capacitors $C_{c1,p}$, $C_{c2,p}$ and resistors $R_{c1,p}$, $R_{d,p}$ included therein, and the second frequency compensation network 126 has capacitors $C_{c1,n}$, $C_{c2,n}$ and resistors $R_{c1,n}$, $R_{c2,n}$ included therein. It should be noted that the first frequency compensation network 116 and the second frequency compensation network 126 have different frequency compensation characteristics due to different circuit structures. Moreover, the transconductance Gm3$p$ of the first driving stage 114 is greater than the transconductance Gm3$n$ of the second driving stage 124. Thus, the driving capability of the first amplifier circuit 102 is greater than that of the second amplifier circuit 104 though the first amplification stage 112 and the second amplification stage 122 are arranged in a fully-differential configuration. In addition, the first load 128 is a single-ended load such as a headphone speaker or an external amplifier required to be driven by the amplifier 100, whereas the second load 130 is a light load.

It should be noted that in an alternative design, the second frequency compensation network 126 in FIG. 3 may also employ the DFCFC structure; however, at least one of the circuit elements in the same DFCFC structure has different settings for the first frequency compensation network 116 and the second frequency compensation network 126. This also obeys the spirit of the present invention, and falls within the scope of the present invention.

As shown in FIG. 2 and FIG. 3, the first load 128 is a single-ended load required to be driven by the amplifier 100, and the second load 130 has a fixed load value. As the second load 130 is fixed, the frequency response of the second amplifier circuit 104 is substantially fixed after the second frequency compensation network 126 is set. If the single-ended load has a fixed load value, the first frequency compensation network 116 may be properly configured to make the frequency response of the first amplifier circuit 102 substantially fixed/stabilized. However, the load value of the single-ended load may vary under different frequency bands. In addition, the amplifier 100 may be used to drive different headphone speakers. As a result, the load value variation of the single-ended load may cause significant variation of the quality factor (Q factor) of complex poles corresponding to the first signal path in which the first amplifier circuit 102 is disposed, resulting in degraded amplifier stability. The present invention therefore proposes another amplifier design to solve this problem.

Figure 4:
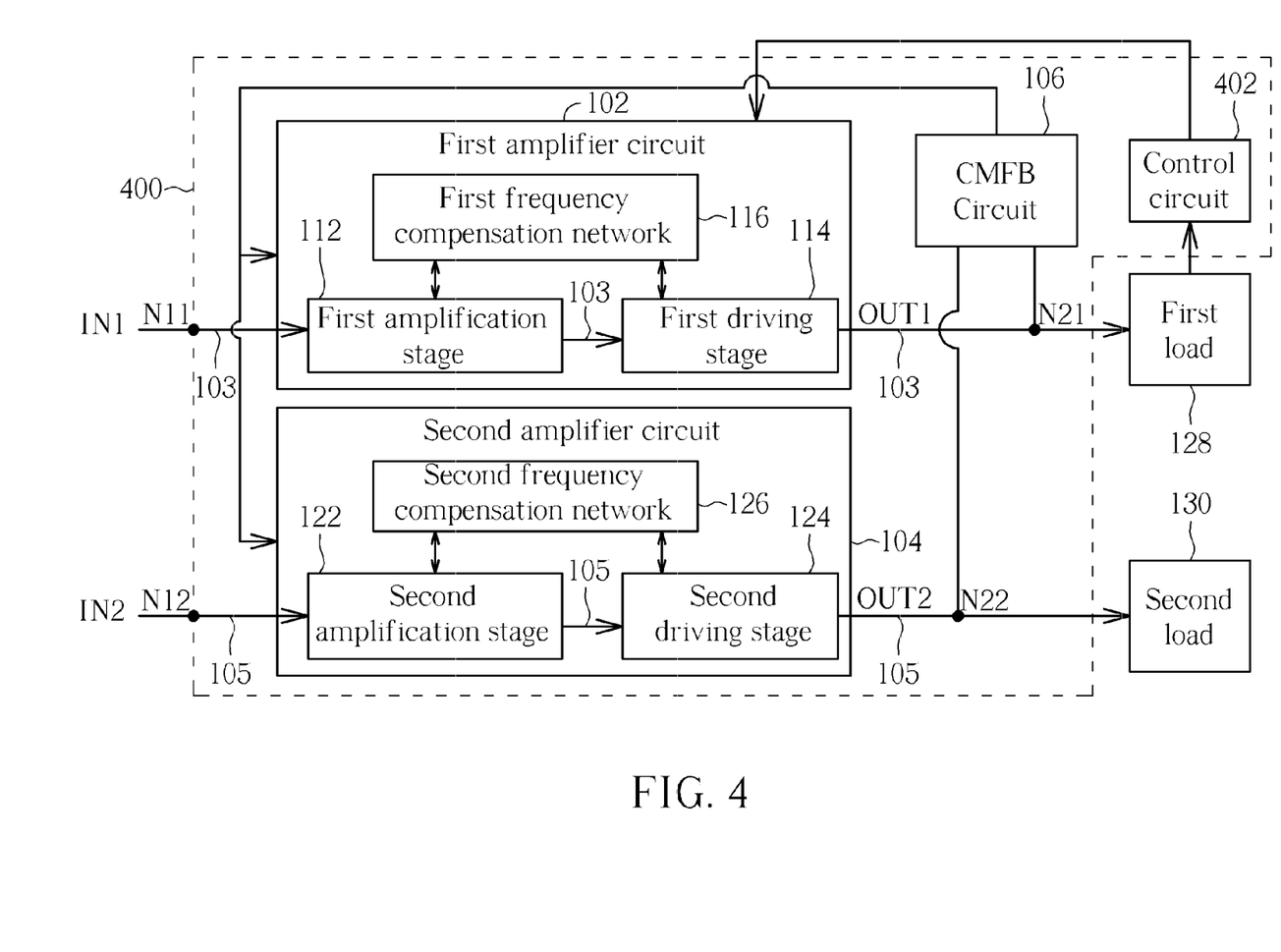
FIG. 4 is a block diagram illustrating an amplifier for processing a differential input according to a second exemplary embodiment of the present invention.

Please refer to FIG. 4, which is a block diagram illustrating an amplifier for processing a differential input according to a second exemplary embodiment of the present invention. The amplifier 400 has all the functional blocks included in the amplifier 100 shown in FIG. 1, and additionally includes a control circuit 402 coupled between the first amplifier circuit 102 and the first load 128. The control circuit 402 is arranged to detect a characteristic value of the first load 128 to generate a detection result and adjust the first amplifier circuit 102 according to the detection result to make the Q factor of poles corresponding to the first signal path stabilized within a desired range. In one implementation, the control circuit 402 adjusts the first frequency compensation network 116 to stabilize the Q factor of poles corresponding to the first signal path. By way of example, but not limitation, the control circuit 402 is arranged to adjust at least one of a frequency compensation characteristic of the first frequency compensation network 116 and a driving capability of the first driving stage 114. For instance, the control circuit 402 is arranged to adjust the frequency compensation characteristic of the first frequency compensation network 112 by adjusting a resistive value/capacitive value of at least one adjustable circuit element within the first frequency compensation network (i.e., adjusting a resistive value or a capacitive value of the first frequency compensation network), and/or arranged to adjust the driving capability of the first driving stage by adjusting a supplied current (e.g., a bias current) of the first driving stage 114. In this way, the amplifier stability is maintained regardless of the load value variation of the first load 128.

By way of example, but not limitation, the aforementioned characteristic value is a load value of the first load 128, such as a capacitance value of the first load 128. Thus, the control circuit 402 adjusts the first frequency compensation network 116 according to the detected load value of the first load 128. However, this is for illustrative purposes only. That is, the spirit of the present is obeyed as long as the control circuit 402 adjusts the first frequency compensation network according to the detection result derived from a characteristic value of the first load 128.

In addition, regarding the amplifier 400 shown in FIG. 4, the first amplifier circuit 102 and the second amplifier circuit 104 may have different driving capabilities to reduce the output distortion, and/or the first frequency compensation network 116 and the second frequency compensation network 126 may have different frequency compensation characteristics. As a person skilled in the art can readily understand details of above-mentioned features after reading above paragraphs directed to the exemplary amplifier 100 shown in FIG. 1, further description is omitted here for brevity. To put it simply, no matter whether the internal amplifier circuits have different driving capabilities and/or different frequency compensation characteristics, any amplifier which processes a differential input and employs the proposed adjustment scheme to make a Q factor of poles corresponding to the first signal path stabilized within a desired range obeys the spirit of the present invention.

Figure 5:
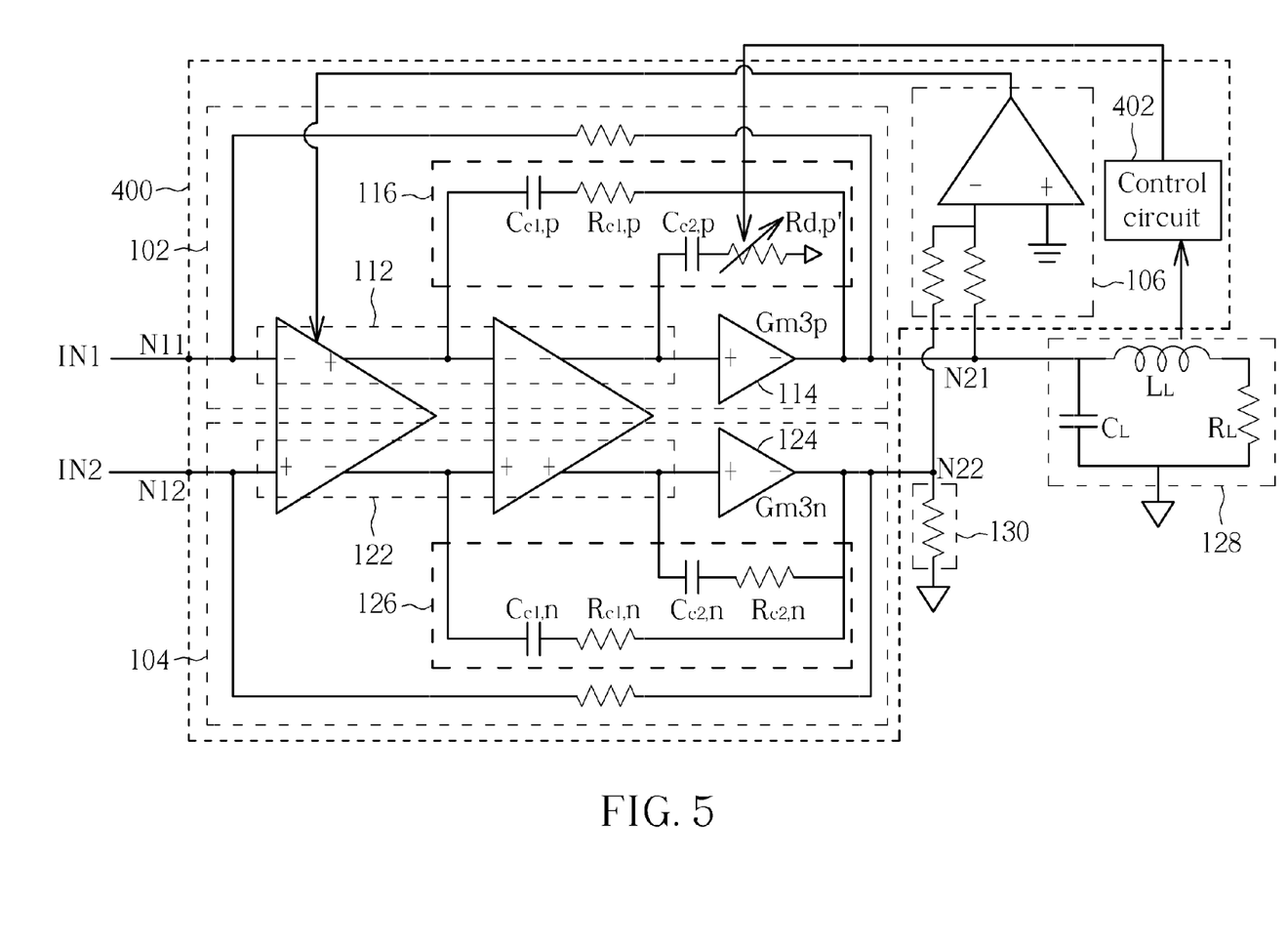
FIG. 5 is a circuit diagram illustrating an exemplary implementation of the amplifier shown in FIG. 4.

Please refer to FIG. 5, which is a circuit diagram illustrating an exemplary implementation of the amplifier 400 shown in FIG. 4. The circuit structure of the amplifier 400 shown in FIG. 5 is similar to the circuit structure shown in FIG. 3. The major difference is that the resistance value of the resistor $R_{d,p}'$ is adjustable and controlled by the control circuit 402. In a case where the first load 128 is a headphone speaker, the load inductor $L_L$ of the first load 128 may have an inductance value within a range of 1~50 uH, the load capacitor $C_L$ of the first load 128 may have a capacitance value within a range of 10 pF~1 nF, and the load resistor $R_L$ may have a resistance value equal to 16Ω. By way of example, but not limitation, the control circuit 402 may set the resistance value of the resistor $R_{d,p}'$ according to a load detection result such as the detected capacitance value of the load capacitor $C_L$.

In this embodiment shown in FIG. 5, the first frequency compensation network 116 employs a DFCFC structure with a variable resistor $R_{d,p}'$, and the second frequency compensation network 126 employs an NMCNR structure. However, in an alternative design, as long as the first frequency compensation network 116 and the second frequency compensation network 126 are properly configured to have different frequency compensation characteristics, the second frequency compensation network 126 may employ a DFCFC structure.

Figure 6:
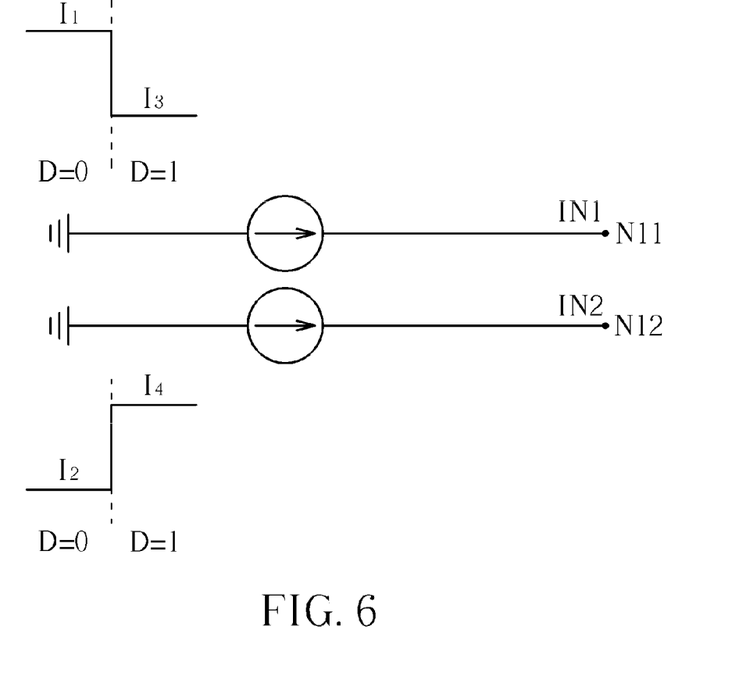
FIG. 6 is a diagram illustrating a differential current input.

The differential input, including the first input signal IN1 and the second input signal IN2, may be a differential voltage input or a differential current input. FIG. 6 is a diagram illustrating a differential current input. By way of example, but not limitation, the differential current input may be generated from a current-steering DAC. As shown in FIG. 6, when a data bit "0" is to be transmitted, a current $I_1$ is generate to the first input node N11 to act as the first input signal IN1, and a current $I_2$ is drained from the second input node N12 to act as the second input signal IN2; and when a data bit "1" is to be transmitted, a current $I_3$ is drained from the first input node N11 to act as the first input signal IN1, and a current $I_4$ is generated to the second input node N12 to act as the second input signal IN2. In one embodiment, the current value of the current $I_1$ may be identical the current value of the current $I_4$, and the current value of the current $I_2$ may be identical the current value of the current $I_3$.

Figure 7:
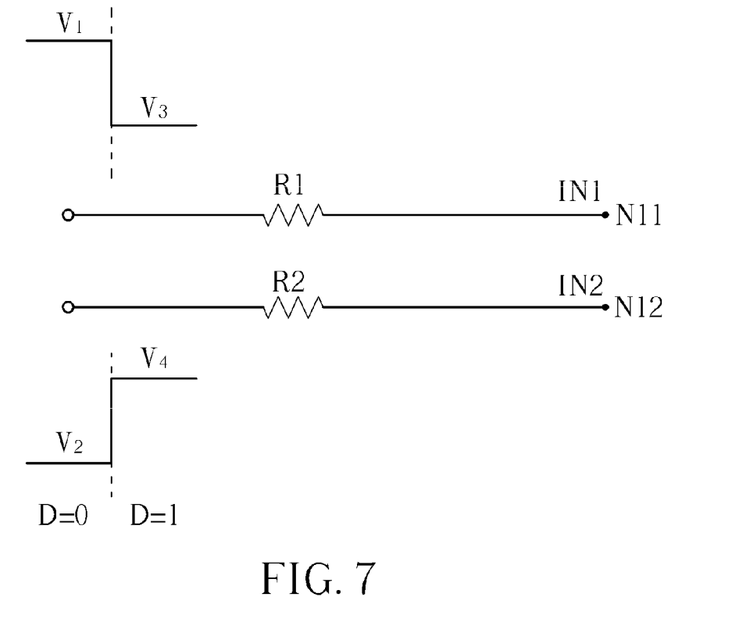
FIG. 7 is a diagram illustrating a differential voltage input.

FIG. 7 is a diagram illustrating a differential voltage input. As shown in FIG. 7, when a data bit "0" is to be transmitted, a voltage $V_1$ is applied to the first input node N11 to introduce the first input signal IN1, and a voltage $V_2$ is applied to the second input node N12 to introduce the second input signal IN2; and when a data bit "1" is to be transmitted, a voltage $V_3$ is applied to the first input node N11 to introduce the first input signal IN1, and a voltage $V_4$ is applied to the second input node N12 to introduce the second input signal IN2. In one embodiment, the voltage value of the voltage $V_1$ may be identical the voltage value of the voltage $V_4$, and the voltage value of the voltage $V_2$ may be identical the voltage value of the voltage $V_3$.

In the embodiments shown in FIG. 2, FIG. 3, and FIG. 5, the second driving stage 124 is particularly designed to have smaller transconductance Gm3n. In addition, in contrast to increasing the transconductance of the driving stage to achieve improved amplifier stability, the properly designed first and second frequency compensation networks 116 and 126 allow the second driving stage 124 to have smaller transconductance without degrading the amplifier stability. In this way, the power consumption of the pseudo-differential amplifier 100 is lower than that of the conventional fully-differential amplifier.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An amplifier for processing a differential input received at a differential input port, the differential input including a first input signal and a second input signal, the amplifier comprising:
   a first amplifier circuit, disposed in a first signal path between a first input node of the differential input port and a first output node of the amplifier, the first amplifier circuit arranged to amplify the first input signal received at the first input node and accordingly generate a first amplified signal to the first output node; and
   a second amplifier circuit, disposed in a second signal path between a second input node of the differential input port and a second output node of the amplifier, the second amplifier circuit arranged to amplify the second input signal received at the second input node and accordingly generate a second amplified signal to the second output node;
   wherein a driving capability of the first amplifier circuit is different from a driving capability of the second amplifier circuit, and a loop gain response of the first amplifier circuit is substantially identical to a loop gain response of the second amplifier circuit.

2. The amplifier of claim 1, wherein a first load driven by the first amplified signal has a load value different from a load value of a second load driven by the second amplified signal.

3. The amplifier of claim 2, wherein the first load is a single-ended load.

4. The amplifier of claim 1, wherein the first amplifier circuit includes a first amplification stage and a first driving stage, where the first amplification stage is coupled between the first input node and the first driving stage, and the first driving stage is coupled between the first amplification stage and the first output node; the second amplifier circuit includes a second amplification stage and a second driving stage, where the second amplification stage is coupled between the second input node and the second driving stage, and the second driving stage is coupled between the second amplification stage and the second output node; the first amplification stage and the second amplification stage are arranged in a fully-differential configuration; and a driving capability of the first driving stage is different from a driving capability of the second driving stage.

5. The amplifier of claim 1, wherein the first amplifier circuit has a first frequency compensation network included therein, the second amplifier circuit has a second frequency compensation network included therein, and a frequency compensation characteristic of the first frequency compensation network is different from a frequency compensation characteristic of the second frequency compensation network.

6. The amplifier of claim 5, wherein the first frequency compensation network and the second frequency compensation network have a same circuit structure.

7. The amplifier of claim 5, wherein the first frequency compensation network employs a nested miller compensation with nulling resistor (NMCNR) structure or a damping factor control frequency compensation (DFCFC) structure, and the second frequency compensation network employs the NMCNR structure or the DFCFC structure.

8. The amplifier of claim 1, wherein the first amplifier circuit is arranged to generate the first amplified signal to the first output node for driving a first load, and the amplifier further comprises:
   a control circuit, coupled between the first amplifier circuit and the first load, the control circuit arranged to detect a characteristic value of the first load to generate a detection result and adjust the first amplifier circuit according to the detection result.

9. The amplifier of claim 8, wherein the characteristic value is a load value.

10. The amplifier of claim 9, wherein the first amplifier circuit has a frequency compensation network included therein, and the control circuit adjusts the first frequency compensation network according to the detected load value.

11. The amplifier of claim 8, wherein the first amplifier circuit has a first frequency compensation network included therein, the control circuit adjusts the first frequency compensation network according to the detection result, the second amplifier circuit has a second frequency compensation network included therein, and a frequency compensation characteristic of the first frequency compensation network is different from a frequency compensation characteristic of the second frequency compensation network.

12. The amplifier of claim 11, wherein the first frequency compensation network and the second frequency compensation network have a same circuit structure.

13. The amplifier of claim 11, wherein the first frequency compensation network employs a nested miller compensation with nulling resistor (NMCNR) structure or a damping factor control frequency compensation (DFCFC) structure, and the second frequency compensation network employs the NMCNR structure or the DFCFC structure.

14. The amplifier of claim 8, wherein the first amplifier circuit comprises a first frequency compensation network and a first driving stage, and the control circuit is arranged to adjust at least one of a frequency compensation characteristic of the first frequency compensation network and a driving capability of the first driving stage.

15. The amplifier of claim 14, wherein the control circuit is arranged to adjust the frequency compensation characteristic of the first frequency compensation network by adjusting a resistive value or a capacitive value of the first frequency compensation network, or arranged to adjust the driving capability of the first driving stage by adjusting a supplied current of the first driving stage.

16. The amplifier of claim 8, wherein the second amplifier circuit generates the second amplified signal to the second output node for driving a second load, and a load value of the first load is different from a load value of the second load.

17. The amplifier of claim 16, wherein the first load is a single-ended load.

18. An amplifier for processing a differential input received at a differential input port, the differential input including a first input signal and a second input signal, the amplifier comprising:
   a first amplifier circuit, disposed in a first signal path between a first input node of the differential input port and a first output node of the amplifier, the first amplifier circuit arranged to amplify the first input signal received at the first input node and accordingly generate a first amplified signal to the first output node; and
   a second amplifier circuit, disposed in a second signal path between a second input node of the differential input port and a second output node of the amplifier, the second amplifier circuit arranged to amplify the second input signal received at the second input node and accordingly generate a second amplified signal to the second output node;
   wherein a driving capability of the first amplifier circuit is different from a driving capability of the second amplifier circuit, the first amplifier circuit has a first frequency compensation network included therein, the second amplifier circuit has a second frequency compensation network included therein, and a frequency compensation characteristic of the first frequency compensation network is different from a frequency compensation characteristic of the second frequency compensation network.

19. The amplifier of claim 18, wherein the first frequency compensation network and the second frequency compensation network have a same circuit structure.

20. The amplifier of claim 18, wherein the first frequency compensation network employs a nested miller compensation with nulling resistor (NMCNR) structure or a damping factor control frequency compensation (DFCFC) structure, and the second frequency compensation network employs the NMCNR structure or the DFCFC structure.

21. The amplifier of claim 18, wherein a first load driven by the first amplified signal has a load value different from a load value of a second load driven by the second amplified signal.

22. The amplifier of claim 18, wherein the first load is a single-ended load.

23. The amplifier of claim 18, wherein the first amplifier circuit includes a first amplification stage and a first driving stage, where the first amplification stage is coupled between the first input node and the first driving stage, and the first driving stage is coupled between the first amplification stage and the first output node; the second amplifier circuit includes a second amplification stage and a second driving stage, where the second amplification stage is coupled between the second input node and the second driving stage, and the second driving stage is coupled between the second amplification stage and the second output node; the first amplification stage and the second amplification stage are arranged in a fully-differential configuration; and a driving capability of the first driving stage is different from a driving capability of the second driving stage.

24. An amplifier for processing a differential input received at a differential input port, the differential input including a first input signal and a second input signal, the amplifier comprising:

a first amplifier circuit, disposed in a first signal path between a first input node of the differential input port and a first output node of the amplifier, the first amplifier circuit arranged to amplify the first input signal received at the first input node and accordingly generate a first amplified signal to the first output node; and a second amplifier circuit, disposed in a second signal path between a second input node of the differential input port and a second output node of the amplifier, the second amplifier circuit arranged to amplify the second input signal received at the second input node and accordingly generate a second amplified signal to the second output node;

wherein a driving capability of the first amplifier circuit is different from a driving capability of the second amplifier circuit, and a first load driven by the first amplified signal has a load value different from a load value of a second load driven by the second amplified signal.

25. The amplifier of claim 24, wherein the first load is a single-ended load.

26. The amplifier of claim 24, wherein the first amplifier circuit includes a first amplification stage and a first driving stage, where the first amplification stage is coupled between the first input node and the first driving stage, and the first driving stage is coupled between the first amplification stage and the first output node; the second amplifier circuit includes a second amplification stage and a second driving stage, where the second amplification stage is coupled between the second input node and the second driving stage, and the second driving stage is coupled between the second amplification stage and the second output node; the first amplification stage and the second amplification stage are arranged in a fully-differential configuration; and a driving capability of the first driving stage is different from a driving capability of the second driving stage.

* * * * *